(12) United States Patent
Jeng

(10) Patent No.: US 11,256,980 B2
(45) Date of Patent: Feb. 22, 2022

(54) METHOD OF OPERATING ARTIFICIAL NEURAL NETWORK WITH NONVOLATILE MEMORY DEVICES

(71) Applicant: Chung Yuan Christian University, Taoyuan (TW)

(72) Inventor: Syang-Ywan Jeng, Taipei (TW)

(73) Assignee: CHUNG-YUAN CHRISTIAN UNIVERSITY, Taoyuan (TW)

( * ) Notice: Subject to any disclaimer, the term of this patent is extended or adjusted under 35 U.S.C. 154(b) by 902 days.

(21) Appl. No.: 16/028,366

(22) Filed: Jul. 5, 2018

(65) Prior Publication Data
US 2019/0087715 A1 Mar. 21, 2019

(30) Foreign Application Priority Data
Sep. 15, 2017 (TW) .................................. 106131744

(51) Int. Cl.
| G11C 11/54 | (2006.01) |
| G06N 3/063 | (2006.01) |
| G06N 3/04 | (2006.01) |
| G06N 5/04 | (2006.01) |
| G11C 16/04 | (2006.01) |

(Continued)

(52) U.S. Cl.
CPC ............. *G06N 3/063* (2013.01); *G06N 3/049* (2013.01); *G06N 3/08* (2013.01); *G06N 5/046* (2013.01); *G11C 11/1655* (2013.01); *G11C 11/1657* (2013.01); *G11C 11/1673* (2013.01); *G11C 11/1675* (2013.01); *G11C 11/54* (2013.01); *G11C 13/0004* (2013.01); *G11C 13/004* (2013.01); *G11C 13/0026* (2013.01); *G11C 13/0028* (2013.01); *G11C 13/0069* (2013.01); *G11C 16/0475* (2013.01); *G11C 16/08* (2013.01); *G11C 16/10* (2013.01); *G11C 16/24* (2013.01); *G11C 16/26* (2013.01)

(58) Field of Classification Search
CPC .......... G06N 3/063; G06N 3/08; G06N 3/049; G06N 5/046; G11C 16/0475; G11C 16/08; G11C 11/1673; G11C 13/0069; G11C 11/1655; G11C 16/24; G11C 13/0026; G11C 13/0028; G11C 11/1675; G11C 13/0004; G11C 16/10; G11C 11/1657; G11C 16/26; G11C 13/004; G11C 11/54
USPC .............................................. 365/167, 185.09
See application file for complete search history.

(56) References Cited

U.S. PATENT DOCUMENTS 7,512,572 B2 * 3/2009 Furber ..................... G11C 8/06
706/15
8,909,576 B2 * 12/2014 Akopyan ................. G06N 3/04
706/27

(Continued)

*Primary Examiner* — Tha-O H Bui

(57) ABSTRACT

A method for operating artificial neural network with nonvolatile memory device having at least one artificial neural nonvolatile memory network. The forgoing artificial neural nonvolatile memory network (ANN) comprises M×N numbers nonvolatile memory cells that are arranged to form a memory array, and the nonvolatile memory cell can be a non-overlapped implementation (NOI) MOSFET, a RRAM element, a PCM element, a MRAM element, or a SONOS element. By applying this novel method to the ANN, it is able to perform feedforward and recurrent operations in the M×N numbers of nonvolatile memory devices in the ANN, so as to adjust or correct the weights stored in the M×N numbers of nonvolatile memory devices.

14 Claims, 10 Drawing Sheets

(51) Int. Cl.
*G11C 16/08* (2006.01)
*G11C 11/16* (2006.01)
*G11C 13/00* (2006.01)
*G06N 3/08* (2006.01)
*G11C 16/24* (2006.01)
*G11C 16/10* (2006.01)
*G11C 16/26* (2006.01)

(56) References Cited

U.S. PATENT DOCUMENTS 10,169,701 B2 * 1/2019 Hosokawa ........... G06N 3/0635
2007/0297239 A1 * 12/2007 Soerensen .............. G11C 16/12
365/185.23

* cited by examiner

METHOD OF OPERATING ARTIFICIAL NEURAL NETWORK WITH NONVOLATILE MEMORY DEVICES

BACKGROUND OF THE INVENTION

1. Field of the Invention

The present invention relates to the technology field of nonvolatile memory elements or devices, and more particularly to a method of operating artificial neural network with nonvolatile memory devices.

2. Description of the Prior Art

Electrically erasable programmable read-only memory (EEPROM) is a type of nonvolatile memory used in computers and other electronic devices to store data and allowing individual data bit to be erased and reprogrammed. Flash is one kind of EEPROM, which has been widely applied in commercial flash memory devices such as USB flash drives or memory cards because of being able to be erased by blocks.

When a flash memory device normally works, data accesses can be achieved by applying operations of writing, erasing and/or reading to its one or more nonvolatile memory devices. It is worth mentioning that, data (bits) verification procedures would be subsequently activated for determining whether there are any fail bits stored in the nonvolatile memory devices after the writing or erasing operation is finished. Herein, the said fail bits mean that the data bits stored in the nonvolatile memory devices does not meet the standards of target bits. FIG. 1 shows a waveform diagram for depicting a writing signal with periodic constant pulse voltages. When some of the nonvolatile memory devices in the flash memory device are detected to store with "fail data (bits)" during the data verification procedures, the writing signal with periodic constant pulse voltages as shown in FIG. 1 is adopted for applying at least one data re-writing operation to those nonvolatile memory devices having fail bits, so as to correct the fail bits and then make all of the nonvolatile memory devices in the flash memory device meet the standards of target bits.

Above-describing method for correcting the fail bits of the nonvolatile memory devices can be implemented into the flash memory device by using simple peripheral circuit units. Moreover, when using this method to repair the fail bits in one or more nonvolatile memory devices, the other nonvolatile memory devices would not be influenced by the writing signal applied to those nonvolatile memory devices having fail bits. However, it needs to note that, the writing signal as shown in FIG. 1 fails to effectively adjust or repair the fail bits of the nonvolatile memory devices in the flash memory device in the case of the fact that the flash memory device comprising huge number of nonvolatile memory devices.

From above descriptions, it is understood that how to design or develop a method for effectively adjust or repair the fail bits from a huge number of nonvolatile memory devices in a flash memory chip has now become an important issue. In view of the, inventors of the present application have made great efforts to make inventive research thereon and eventually provided a Method of operating artificial neural network with nonvolatile memory devices.

SUMMARY OF THE INVENTION

The primary objective of the present invention is to provide a Method of operating artificial neural network with nonvolatile memory devices. In the present invention, a plurality of nonvolatile memory devices or a nonvolatile memory array comprising the nonvolatile memory devices and necessary circuit units are integrated to an artificial neural nonvolatile memory network. By such arrangement, it is able to perform feedforward and recurrent operations in the M×N number of nonvolatile memory devices in the nonvolatile memory array, so as to adjust or correct the data bits stored in the M×N number of nonvolatile memory devices through the operating function of the artificial neural network with nonvolatile memory devices.

In order to achieve the primary objective of the present invention, the inventor of the present invention provides an embodiment of the Method of operating artificial neural network with nonvolatile memory devices, comprising following steps:

(1) providing an artificial neural nonvolatile memory network with the nonvolatile memory device; wherein the artificial neural nonvolatile memory network is electrically connected to a controlling unit, and comprising: a decoder unit electrically connected to the controlling unit, a bit line voltage regulating unit electrically connected to the decoder unit, a word line voltage regulating unit electrically connected to the decoder unit, a nonvolatile memory array electrically connected to the bit line voltage regulating unit and the word line voltage regulating unit, and a plurality of current-to-voltage converters electrically connected to the nonvolatile memory array and the controlling unit; wherein the nonvolatile memory array comprises M×N number of nonvolatile memory devices electrically connected with M number of word lines and N number of bit lines;

(2) using the controlling unit to produce an input voltage set comprising M number of input voltages;

(3) the controlling unit applying a reading operation by electrically biasing the nonvolatile memory array through the decoder unit, the word line voltage regulating unit, and the bit line voltage regulating unit, wherein the M number of input voltages are applied to the word lines of nonvolatile memory devices;

(4) From the first column to the N-th column of the nonvolatile memory array, the plurality of current-to-voltage converters collecting total output currents received from the M number of nonvolatile memory devices arranged in each column of the nonvolatile memory array, respectively; moreover, N number of summed currents being further converted to N number of output voltages, respectively;

(5) the controlling unit converting the N number of output voltages to N number of output values based on a predetermined relation to a reference voltage, respectively;

(6) subtracting a target value from each of the N number of output values, so as to produce N number of error values;

(7) using the controlling unit to apply a adjusting operation to the M×N number of nonvolatile memory devices based on the corresponding N number of error values;

(8) repeatedly executing the steps (2)-(7) until all errors are within a predetermined range;

(9) optionally adjusting the reference voltage to a predetermined level; and

(10) repeatedly executing the steps (2)-(9) until there is no need to adjust the reference voltage.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a method of operating artificial neural network with nonvolatile memory devices disclosed by the present invention, embodiments of the present invention will be described in detail with reference to the attached drawings hereinafter.

Figure 1:
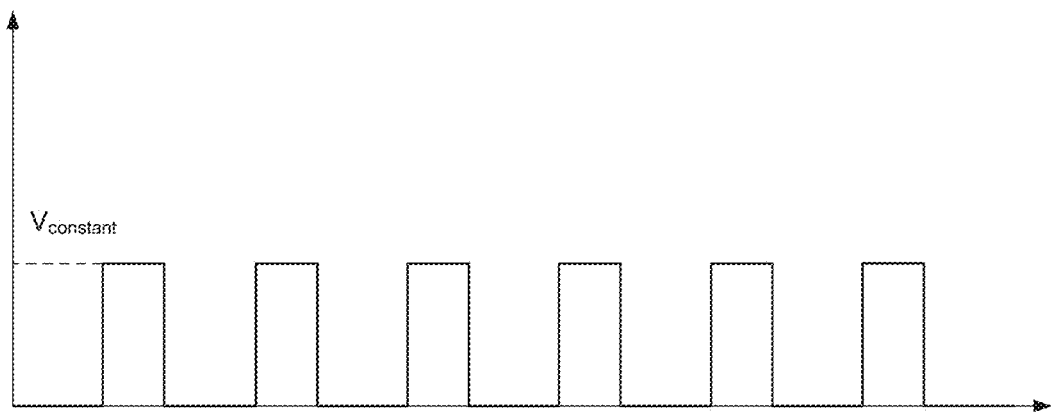
FIG. 1 shows a waveform diagram for depicting a writing signal with periodic constant pulse voltages.
Figure 2:
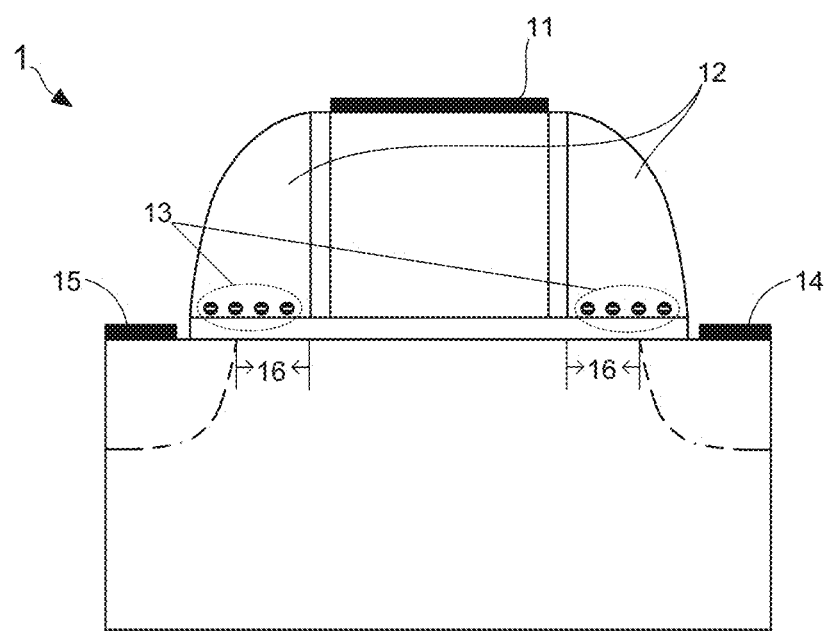
FIG. 2 shows a cross-sectional side view of a non-overlapped implementation (NOI) MOSFET.

With reference to FIG. 2, there is provided a cross-sectional side view of a non-overlapped implementation (NOI) MOSFET. NOI MOSFET 1 is a novel nonvolatile memory device capable of being stored with data bit 13 in its two spacers 12 after finishing a writing (programming) operation carried out by channel hot electron injection (CHEI). By respectively applying a first positive voltage and a second positive voltage to a gate terminal 11 and a drain terminal 14 (or source terminal 15) of the NOI MOSFET 1 as well as making the source terminal 15 (or drain terminal 14) to be grounded, electrons flowing out from the source terminal 15 (or drain terminal 14) would be converted to so-called "hot electrons" after being accelerated by electrical field in a channel under the Gate of the NOI MOSFET 1. As a result, the hot electrons moving in the channel inject into the spacer 12 of the NOI MOSFET 1 because of scattering with lattice phonons. On the other hand, the programmed bits (i.e., the injected electrons) in the spacers 12 can also be removed after completing a erasing operation carried out by hot holes injection (HHI). By respectively applying a negative voltage and a positive voltage to the gate terminal 11 and the drain terminal 14 (or source terminal 15) of the NOI MOSFET 1 as well as making the source terminal 15 (or drain terminal 14) to be grounded, holes in the Drain diffusion (or Source diffusion) of the NOI MOSFET 1 become "hot holes" after getting specific energy. Consequently, the hot holes directly inject into the spacers from the Drain diffusion (or Source diffusion) of the NOI MOSFET 1.

In the present invention, the number (or amount) of the injected electrons in the spacer 12 is regarded as a bit weight. Moreover, a data bit adjusting operation can be applied to the NOI MOSFET 1 (i.e., nonvolatile memory device) through completing the writing operation or the erasing operation by one or multi times. It is worth mentioning that, in the present invention, a nonvolatile memory array comprising M×N number of NOI MOSFETs 1 (i.e., nonvolatile memory devices) is particularly integrated in to a nonvolatile memory device comprising at least one artificial neural nonvolatile memory network. By such arrangement, it is able to easily perform data bit adjusting operations in the M×N number of NOI MOSFETs 1, so as to effectively adjust or correct the data bits stored in the spacers 12 of the M×N number of NOI MOSFETs 1 through the operating function of the artificial neural network with nonvolatile memory devices.

Figure 3:
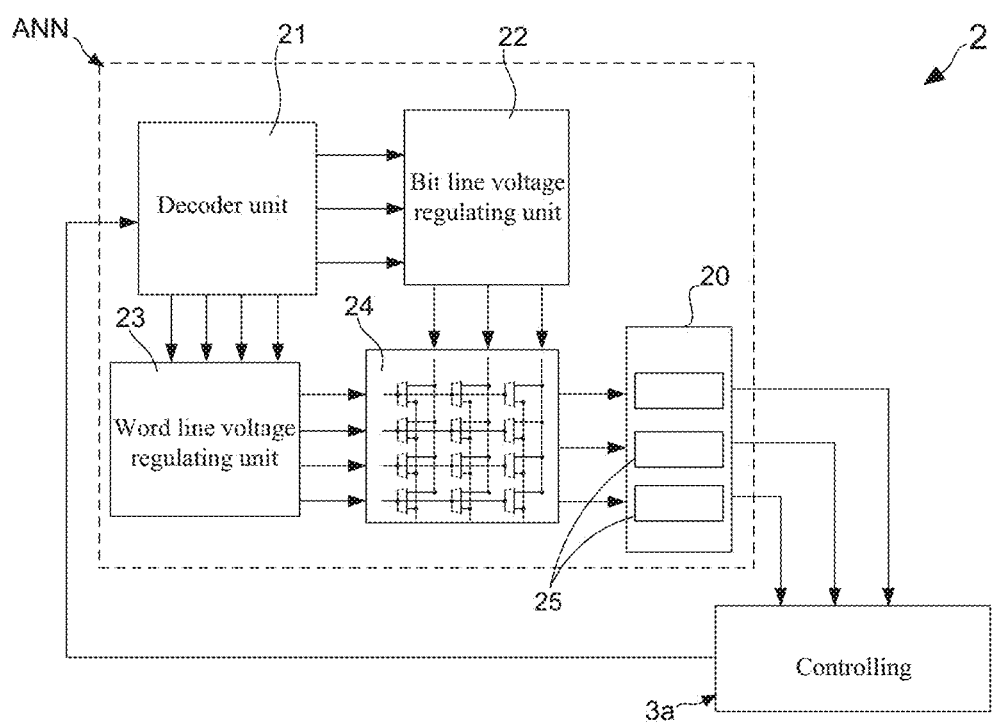
FIG. 3 shows a circuit block diagram of a nonvolatile memory device having an artificial neural nonvolatile memory network therein.

Please refer to FIG. 3, which illustrates a circuit block diagram of a nonvolatile memory device having an artificial neural nonvolatile memory network therein. From FIG. 3, it is understood that the nonvolatile memory device 2 comprises: a nonvolatile memory array 24, bit line voltage regulating unit 22, a word line voltage regulating unit 23, a decoder unit 21, and a current-to-voltage conversion unit 20. In which the bit line voltage regulating unit 22 is electrically connected to the decoder unit 21 and the nonvolatile memory array 24, and the word line voltage regulating unit 23 is also electrically connected to the decoder unit 21 and the nonvolatile memory array 24. Moreover, the nonvolatile memory array 24 is electrically connected to the current-to-voltage conversion unit 20 comprising N number of current-to-voltage convertors 25. On the other hand, the decoder 21 and the current-to-voltage conversion unit 20 are simultaneously electrically connected to the controlling unit 3a.

It is worth explaining that, the said controlling unit 3a can be a microprocessor or a memory chip testing apparatus having host computer. Moreover, despite the fact that the NOI MOSFETs 1 are adopted for being as the M×N number of nonvolatile memory devices in the nonvolatile memory array 24, the nonvolatile memory devices for constituting the nonvolatile memory array 24 does not be limited to be the NOI MOSFETs 1. In practical use, the nonvolatile memory devices can also be floating gate memory cells, resistive random access memory (RRAM) cells, phase-change memory (PCM) cells, magnetoresistive random-access memory (MRAM) cells, or silicon-oxide-nitride-oxide-silicon (SONOS) memory cells.

Figure 4:
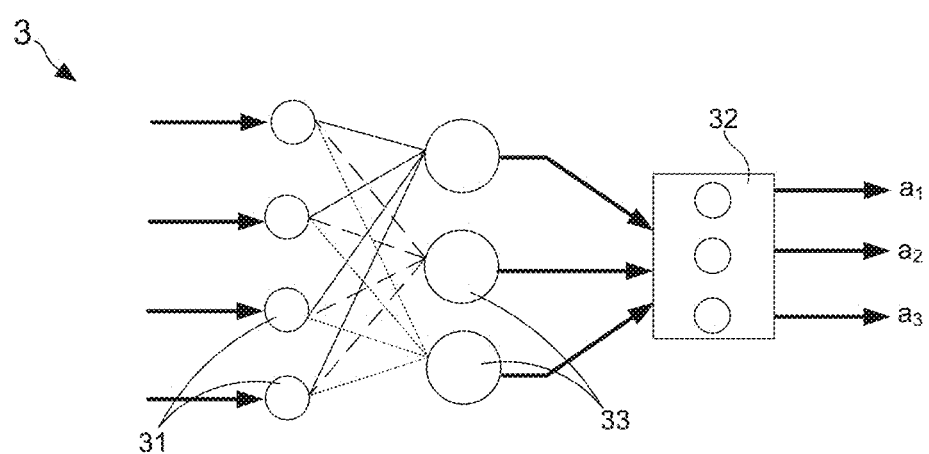
FIG. 4 shows a basic framework diagram of an artificial neural network.

Referring to FIG. 3 again, and please simultaneously refer to FIG. 4 showing a basic framework diagram of an artificial neural network. FIG. 4 depicts that the artificial neural network 3 comprises four input nodes 31, three output nodes 32 and three hidden nodes 33. After inputting data or signals to the three hidden nodes 33 via the four input nodes 31, a Net Input would be subsequently processed or converted by an active function or a mathematical algorithm, such that back-end device is able to received three outputs (a1, a2, a3) from the three output nodes 32. After comparing FIG. 3 with FIG. 4, it is able to find that, a first column of the nonvolatile memory array 24 comprising four nonvolatile memory devices, a second column of the nonvolatile memory array 24 comprising four of nonvolatile memory devices, and a third column of the nonvolatile memory array 24 comprising four nonvolatile memory devices can be regarded as three nerve neurons of an artificial neural network ANN. Obviously, each of the nerve neurons comprises four synapses since every row of the nonvolatile memory array 24 comprises four nonvolatile memory devices.

Figure 5A:
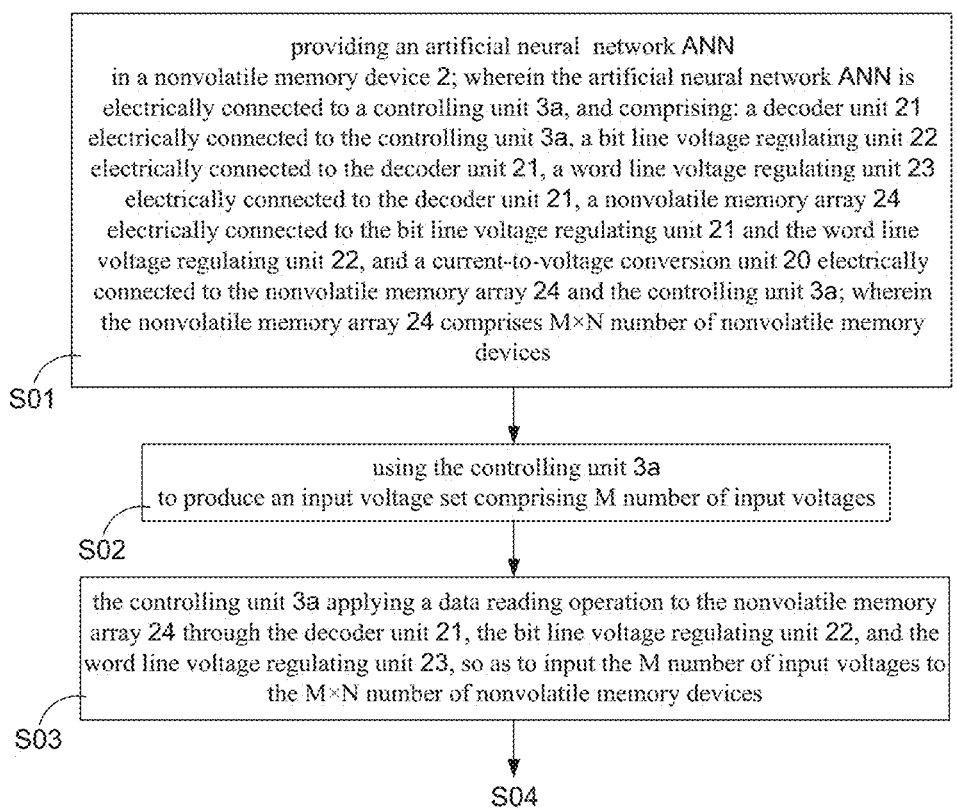
FIG. 5A, FIG. 5B and FIG. 5C show a flowchart diagram of a Method of operating artificial neural network with nonvolatile memory devices according to the present invention.
Figure 5B:
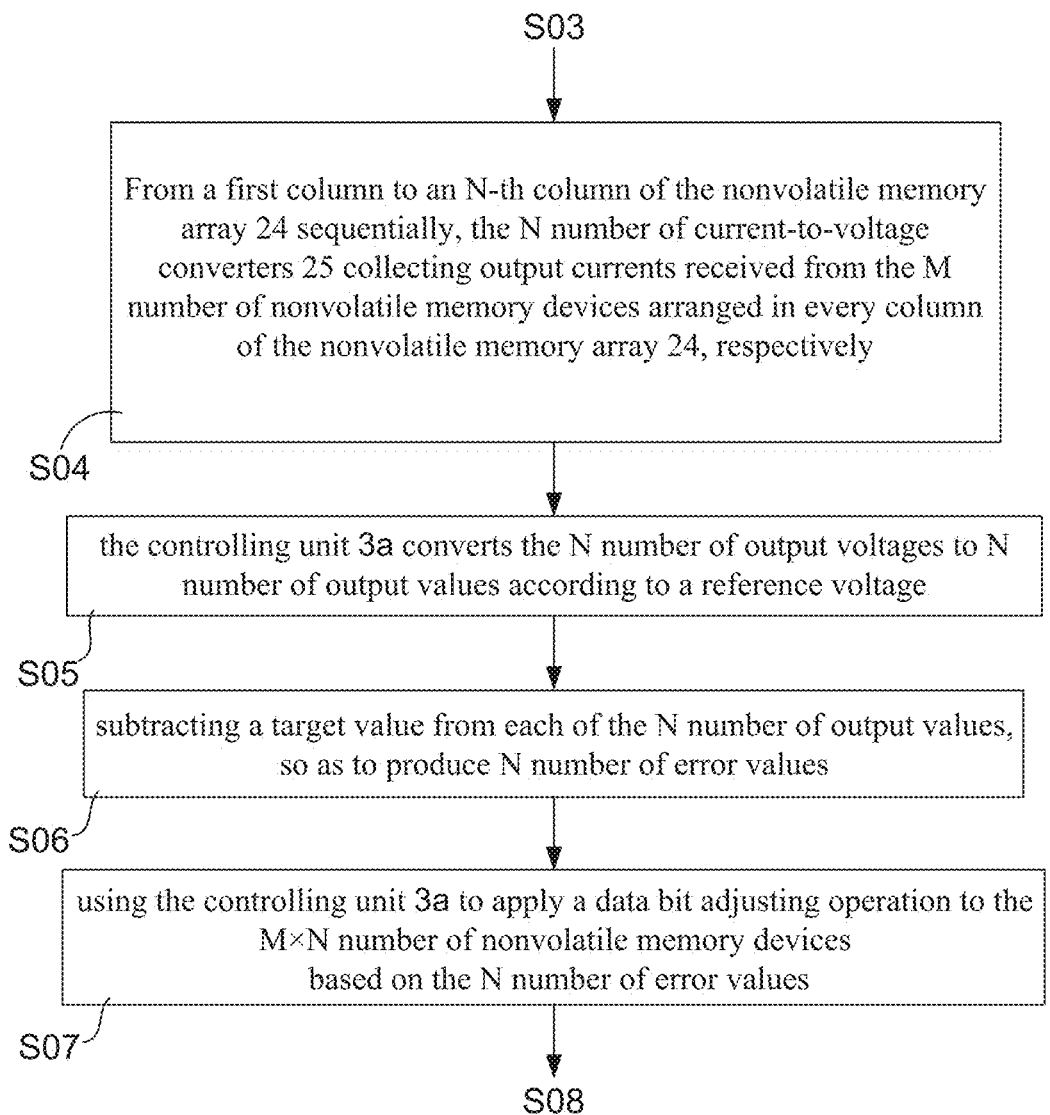
Figure 5C:
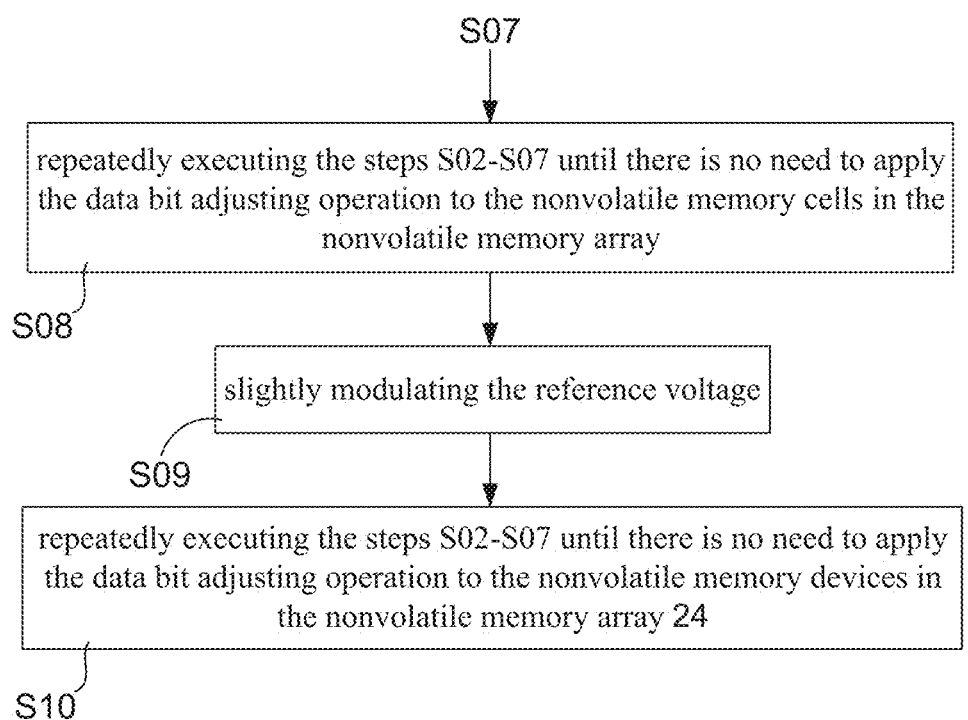

FIG. 5A, FIG. 5B and FIG. 5C show a flowchart diagram of a method of operating artificial neural network with nonvolatile memory devices according to the present invention. As FIG. 3, FIG. 5A, FIG. 5B, and FIG. 5C show, the present invention discloses a method of operating artificial neural network with nonvolatile memory devices 2 having an artificial neural network ANN, wherein the method mainly comprises 10 steps. First of all, the method executes step (S01) to providing an artificial neural network ANN in the nonvolatile memory device 2, wherein the artificial neural network ANN is electrically connected to a controlling unit 3a and comprises: a decoder unit 21 electrically connected to the controlling unit 3a, a bit line voltage regulating unit 22 electrically connected to the decoder unit 21, a word line voltage regulating unit 23 electrically connected to the decoder unit 21, a nonvolatile memory array electrically 24 connected to the bit line voltage regulating unit 22 and the word line voltage regulating unit 23, and a current-to-voltage conversion unit 20 electrically connected to the nonvolatile memory array 24 and the controlling unit 3a. Moreover, FIG. 3 also indicates that the nonvolatile memory array 24 comprises M×N number of nonvolatile memory devices and the current-to-voltage conversion unit 20 comprises N number of current-to-voltage converters 25.

Next, the method flow proceeds to step (S02) for making the controlling unit 3a to produce an input voltage set comprising M number of input voltages. Moreover, when the step (S03) is executed, the controlling unit 3a applies a reading operation to the nonvolatile memory array 24 through the decoder unit 21, the bit line voltage regulating unit 22, and the word line voltage regulating unit 23, so as to input the M number of input voltages to the M×N number of nonvolatile memory devices. It is worth mentioning that the M number of input voltages may have different voltage values. Moreover, it needs to explain that an output current $I_D$ provided by the nonvolatile memory device (i.e., NOI MOSFET 1) can be calculated by using the mathematical equation of $$I_D = I_0 \cdot \left(1 - e^{\frac{-v_{DS}}{v_T}}\right) \cdot e^{\frac{v_{GS}}{mv_T}} \cdot e^{\frac{v_{th}}{mv_T}}.$$

In the mathematical equation, $I_0$ means an output current as $V_{GS}$ is equal to $V_{th}$ and m is a substrate parameter of the NOI MOSFET 1.

Figure 6:
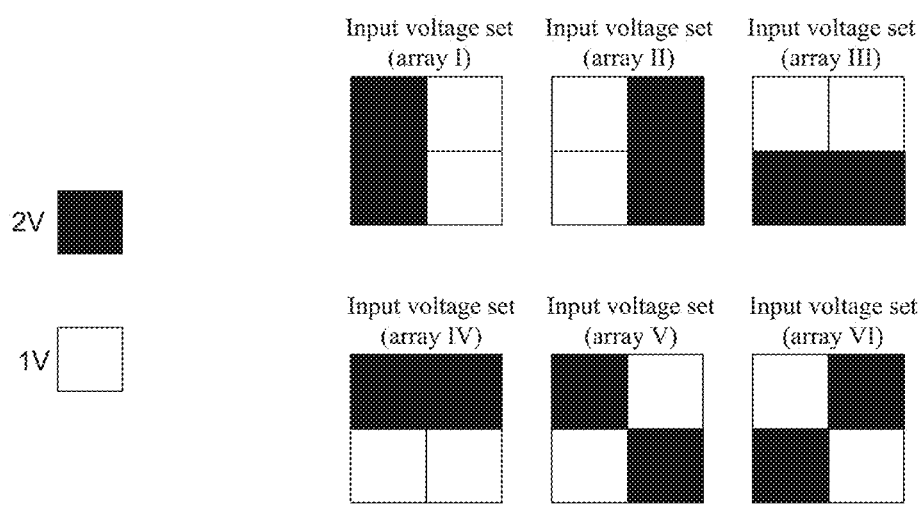
FIG. 6 shows a diagram for describing various input voltage sets comprising M number of input voltages.

With reference to FIG. 6, there is provided a diagram for describing various input voltage sets comprising M number of input voltages. From FIG. 6, it is able to know that the M number of input voltages can be applied to the M×N number of nonvolatile memory devices in the nonvolatile memory array 24 by various array forms. In contrast to the nonvolatile memory array 24 includes four word lines, the input voltage set can be designed to a 2×2 array ($b_{ij}$) comprising four input voltages of ($b_{11}$), ($b_{12}$), ($b_{21}$), and ($b_{22}$). For example, the four input voltages of array I in FIG. 6 have difference voltage values of 2V, 1V, 2V, and 1V, respectively.

The method flow next proceeds to step (S04). Therefore, from a first column to an N-th column of the nonvolatile memory array 24 sequentially, the N number of current-to-voltage converters 25 collecting output currents received from the M number of nonvolatile memory devices arranged in every column of the nonvolatile memory array 24, respectively. As a result, N number of summed currents are correspondingly calculated and then further converted to N number of output voltages. After the step (S04) is finished, the controlling unit 3a converts the N number of output voltages to N number of output values according to a reference voltage while step (S05) is subsequently executed. In the present invention, a hard limit function providing the service as same as the active function or the mathematical algorithm applied in the artificial neural network is particularly implemented into the step (S05), so as to assist in converting the output voltages to the output values. The said hard limit function is represented by following equation (1).

$$f(\text{net}) = \begin{cases} 0, & \text{if net} < S \\ 1, & \text{if net} \geq S \end{cases} \quad (1)$$

In above-presented equation (1), net and S respectively mean the output voltage and the reference voltage, wherein the reference voltage is set to be 1V in the present invention. By such arrangement, it is able to obtain an output value "1" when the output voltage is greater than the reference voltage. On the contrary, when the output voltage is smaller than the reference voltage, the output value is calculated to be "0". After obtaining N number of output values, the method flow continuously proceeds to step (S06) so as to subtract a target value from each of the N number of output values for producing N number of error values. In step (S07), subsequently, the controlling unit 3a applies a data bit adjusting operation to the M×N number of nonvolatile memory devices based on the N number of error values.

Above-mentioned error values are calculated by using equation (2) of E=T−A. In which E, T and A mean the error value, the target value and the output value, respectively. It needs to particularly explain that the target value is set to be 1 or 0 in the present invention. Therefore, relative values of E, T and A can be presumed and integrated in following Table (1).

TABLE 1

| T | A | E |
|---|---|---|
| 1 | 1 | 0 |
| 1 | 0 | 1 |
| 0 | 1 | −1 |
| 0 | 0 | 0 |

From Table (1), electronic engineers skilled in development and manufacture of flash memory devices may find that, when the error value is calculated to be "−1", it is apparently indicated that the nonvolatile memory device (i.e., NOI MOSFET 1) been detected to provide the output value "1" stores a fail bit in its spacer 12. In this case, there is a need to apply the data bit adjusting operation to the nonvolatile memory device, so as to make the output value approach the target value (=0) by the addition of electrons or holes in the space 12 of the nonvolatile memory device.

The said data bit adjusting operation can be a writing operation. As FIG. 2 shows, the nonvolatile memory device (i.e., NOI MOSFET 1) is able to store with data bit 13 in its spacer 12 after finishing the writing (programming) operation carried out by channel hot electron injection (CHEI). By the use of decoder unit 21, bit line voltage regulating unit 22 and word line voltage regulating unit 23, a first positive voltage and a second positive voltage can be applied to the gate terminal 11 and the drain terminal 14 (or source terminal 15) of the NOI MOSFET 1 in the case of grounding the source terminal 15 (or drain terminal 14), such that electrons flowing out from the source terminal 15 (or drain terminal 14) would be converted to so-called "hot electrons" after being accelerated by electrical field in a channel under the Gate of the NOI MOSFET 1. As a result, the hot electrons moving in the channel inject into the spacer 12 of the NOI MOSFET 1 because of scattering with lattice phonons. In the present invention, a programming time for the writing operation is at least 1 μs.

On the contrary, when the data bit adjusting operation is determined to be a erasing operation, the nonvolatile memory device (i.e., NOI MOSFET 1) is capable of being erased with data bit 13 from its spacer 12 after finishing the erasing operation carried out by hot hole injection (HHI). Through the use of decoder unit 21, bit line voltage regulating unit 22 and word line voltage regulating unit 23, a negative voltage and a positive voltage can be applied to the gate terminal 11 and the drain terminal 14 (or source terminal 15) of the NOI MOSFET 1 in the condition of grounding the source terminal 15 (or drain terminal 14), therefore holes in the Drain diffusion (or Source diffusion) of the NOI MOSFET 1 become "hot holes" after getting specific energy. Consequently, the hot holes directly inject into the spacers from the Drain diffusion (or Source diffusion) of the NOI MOSFET 1. In the present invention, an erasing time for the erasing operation is at least 800 μs.

In step (S08), the steps (2)-(7) would be repeatedly executed until there is no need to apply the data bit adjusting operation to the nonvolatile memory devices in the nonvolatile memory array 24. Briefly speaking, the method flow would immediately stop the cycle execution of the steps (2)-(7) as long as all the data bits stored in the nonvolatile memory devices are detected to meet the standards of target bits. In the present invention, the number (or amount) of the electrons in the spacer 12 of the NOI MOSFET 1 is regarded as a bit weight. Accordingly, the data bit adjusting operation can also be regarded as a bit weight adjusting operation.

Figure 7:
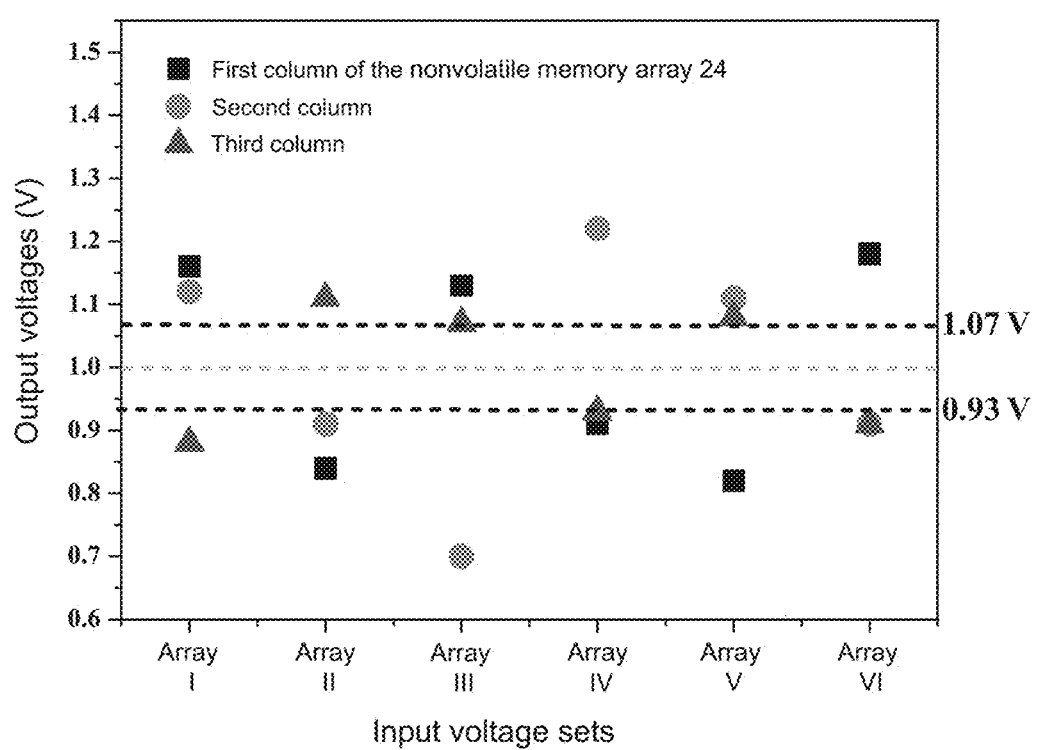
FIG. 7 shows a graphic plot of input voltages versus output voltages.

Next, the method flow continuously proceeds to step (S09) for slightly modulating the reference voltage. Consequently, in step (S10), it is to repeatedly execute the steps (2)-(7) until there is no need to apply the data bit adjusting operation to the nonvolatile memory devices in the nonvolatile memory array 24. FIG. 7 shows a graphic plot of input voltages versus output voltages. In FIG. 7, spare-shaped data points are measured from the first column of the nonvolatile memory array 24 (i.e., the first nerve neuron of the artificial neural network ANN). Moreover, circular-shaped data points and triangular-shaped data points are measured from the second column and the third column of the nonvolatile memory array 24 (i.e., the second nerve neuron and the third nerve neuron of the artificial neural network ANN). From FIG. 7, it is found that, after repeatedly executing the steps (2)-(7) by multi times, the reference voltage used for inspecting the output value "1" is gradually and then eventually increased from 1V to 1.07V. On the contrary, the reference voltage used for inspecting the output value "0" is gradually and then eventually increased from 1V to 0.93V.

Figure 8:
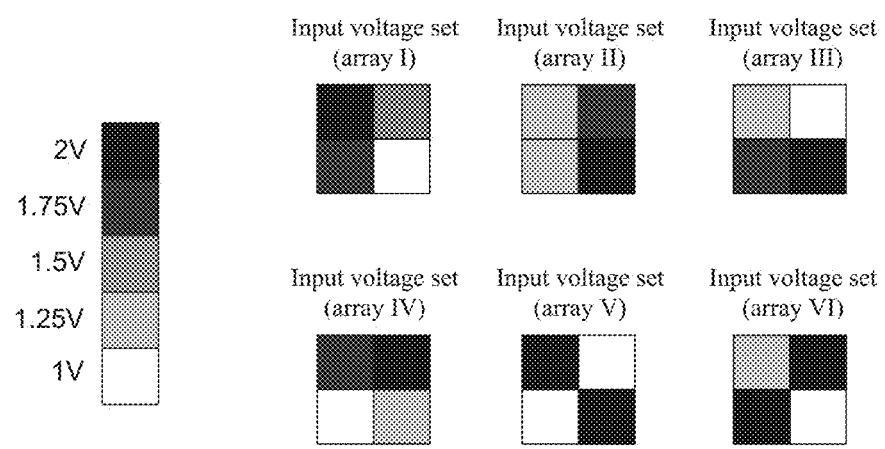
FIG. 8 shows a diagram for describing various array forms for the input voltage set.

It is possible to more effectively finish data bit adjusting operations of all of the M×N number of nonvolatile memory devices in the nonvolatile memory array 24 by changing or re-designing different array forms for the input voltage set. FIG. 8 shows a diagram for describing various array forms for the input voltage set. From FIG. 8, it is understood that the input voltage set comprising M number of input voltages can be designed to a 2×2 array ($b_{ij}$) comprising four input voltages of ($b_{11}$), ($b_{12}$), ($b_{21}$), and ($b_{22}$). For example, the four input voltages of array I in FIG. 8 have difference voltage values of 2V, 1.5V, 1.75V, and 1V, respectively.

In addition, it can also enhance the efficiency of the data bit adjusting operations applied to the nonvolatile memory array 24 by changing or re-designing the step (S05), the step (S06), the step (S07), and the step (S08) as follows:

step (S05): converting the N number of output voltages to $$\frac{N}{2}$$

number of differential values by applying a voltage subtracting process to every two of the N number of output voltages; subsequently, setting the differential voltages greater than a first reference voltage to "11", setting the differential voltages smaller than a second reference voltage to "00", and setting the differential voltages greater than the second reference voltage and smaller than the first reference voltage to "10" or "01", so as to produce $$\frac{N}{2}$$

number of bits states;

step (S06): providing a target state set comprising $$\frac{N}{2}$$

number of target states, and then producing $$\frac{N}{2}$$

number of error states by comparing the $$\frac{N}{2}$$

number of target states with the $$\frac{N}{2}$$

number of bits states;

step (S07): using the controlling unit 3a to apply a data bit adjusting operation to the M×N number of nonvolatile memory devices based on the $$\frac{N}{2}$$

number of error states; and step (S08): repeatedly executing the steps (S02)-(S07') until there is no error states calculated, all of the error states meet corresponding pre-determined states, or a repeat execution time of the steps (S02)-(S07) is achieved.

Therefore, through above descriptions, the method of operating artificial neural network with nonvolatile memory devices 2 having at least one artificial neural network ANN proposed by the present invention have been introduced completely and clearly; in summary, the present invention includes the advantages of:

(1) In the present invention, a plurality of nonvolatile memory devices or a nonvolatile memory array 24 compris-

What is claimed is:

1. A method of operating artificial neural network with nonvolatile memory devices, comprising following steps:
   (1) providing an artificial neural nonvolatile memory network with at least one the nonvolatile memory devices; wherein the artificial neural network is electrically connected to a controlling unit, and comprising:
   a decoder unit electrically connected to the controlling unit, a bit line voltage regulating unit electrically connected to the decoder unit, a word line voltage regulating unit electrically connected to the decoder unit, a nonvolatile memory array electrically connected to the bit line voltage regulating unit and the word line voltage regulating unit, and a plurality of current-to-voltage converters electrically connected to the nonvolatile memory array and the controlling unit; wherein the nonvolatile memory array comprises M×N number of nonvolatile memory devices arranged as M rows by N columns and electrically connected with M number of word lines and N number of bit lines;
   (2) selecting an input voltage set comprising M number of input voltages upon receiving external signals;
   (3) the controlling unit performing a reading operation by electrically biasing the nonvolatile memory array through the decoder unit, the word line voltage regulating unit, and the bit line voltage regulating unit, wherein the M number of input voltages are applied to the word lines of nonvolatile memory devices;
   (4) the current-to-voltage converters collecting total output currents received from the M number of nonvolatile memory devices arranged in each column of the nonvolatile memory array, respectively; moreover, N number of summed currents being further converted to N number of output voltages, respectively;
   (5) converting the N number of output voltages to N number of output values based on a predetermined relation to a reference voltage, respectively;
   (6) providing a set of target values and subtracting each corresponding target value from each of the N number of output values, so as to produce N number of error values;
   (7) using the controlling unit to apply an adjusting operation to the M×N number of nonvolatile memory devices based on the corresponding N number of error values;
   (8) repeatedly executing the steps (2)-(7) until all errors are within a predetermined range or a predetermined number of iterations are reached;
   (9) optionally adjusting the reference voltage to a predetermined level; and
   (10) repeatedly executing the steps (2)-(9) until there is no request to adjust the reference voltage.

2. The method of claim 1, wherein the nonvolatile memory device is selected from the group consisting of non-overlapped implementation (NOI) MOSFET, floating gate memory cell, resistive random access memory (RRAM) cell, phase-change memory (PCM) cell, magnetoresistive random-access memory (MRAM) cell, and silicon-oxide-nitride-oxide-silicon (SONOS) memory cell.

3. The method of claim 1, wherein the adjusting operation is a writing operation and comprises following steps:
   the controlling unit applying programming signals to bias the nonvolatile memory devices for a programming time through the decoder unit, the bit line voltage regulating unit and the word line voltage regulating unit.

4. The method of claim 1, wherein the adjusting operation is an erasing operation and comprises following detail steps:
   the controlling unit applying erasing signals to bias the nonvolatile memory devices for an erasing time through the decoder unit, the bit line voltage regulating unit and the word line voltage regulating unit.

5. The method of claim 3, wherein the writing operation is carried out by making channel hot carrier injection (CHEI) occurring in the nonvolatile memory devices.

6. The method of claim 4, wherein the erasing operation is carried out by making band-to-band tunneling hot carrier injection occurring in the nonvolatile memory devices.

7. The method of claim 1, wherein the adjusting operation can be applied to one nonvolatile memory device or simultaneously multiple nonvolatile memory devices in the nonvolatile memory array.

8. A method of operating artificial neural network with nonvolatile memory devices, comprising following steps:
   (1) providing an artificial neural network with the nonvolatile memory devices; wherein the artificial neural network is electrically connected to a controlling unit, and comprising:
   a decoder unit electrically connected to the controlling unit, a bit line voltage regulating unit electrically connected to the decoder unit, a word line voltage regulating unit electrically connected to the decoder unit, a nonvolatile memory array electrically connected to the bit line voltage regulating unit and the word line voltage regulating unit, and a plurality of current-to-voltage convertors electrically connected to the nonvolatile memory array and the controlling unit; wherein the nonvolatile memory array comprises M×N numbers of nonvolatile memory devices arranged as M rows by N columns and electrically connected with M number of word lines and N number of bit lines;
   (2) selecting an input voltage set comprising M number of input voltages upon receiving external signals;
   (3) the controlling unit performing a reading operation by electrically biasing the nonvolatile memory array through the decoder unit, the word line voltage regulating unit, and the bit line voltage regulating unit, wherein the M number of input voltages are applied to the word lines of nonvolatile memory devices;
   (4) the current-to-voltage converters collecting total output currents received from the M number of nonvolatile memory devices arranged in each column of the nonvolatile memory array, respectively; moreover, N number of summed currents being further converted to N number of output voltages, respectively;

(5) converting the N number of output voltages to $$\frac{N}{2}$$

Number of differential values by applying a voltage subtracting procedure to every two of the N number of output voltages; subsequently, setting the differential voltages greater than a first reference voltage to "11" output state, setting the differential voltages smaller than a second reference voltage to "00" output state, and setting the differential voltages greater than the second reference voltage and smaller than the first reference voltage to "10" or "01" output state, so as to produce $$\frac{N}{2}$$

number of output states;

(6) providing a target state set comprising $$\frac{N}{2}$$

number of target states, and then producing $$\frac{N}{2}$$

number or error states by comparing the $$\frac{N}{2}$$

number or target states with the corresponding $$\frac{N}{2}$$

number of output states;

(7) using the controlling unit to apply an adjusting operation to the M×N number of nonvolatile memory devices based on the corresponding $$\frac{N}{2}$$

number of error states;

(8) repeatedly executing the steps (2)-(7) until all errors are within a predetermined range or a predetermined number of iterations are reached;

(9) if there is a plurality of input voltage sets provided, selecting another input voltage set comprising M number of input voltages from the plurality of input voltage sets and repeatedly executing the steps (3)-(8) until all input voltages sets are selected;

(10) selecting the first input voltage set comprising M number of input voltages upon receiving external signals;

(11) the controlling unit applying a reading operation by electrically biasing the nonvolatile memory array through the decoder unit, the word line voltage regulating unit, and the bit line voltage regulating unit, wherein the M number of input voltages are applied to the word lines of nonvolatile memory devices;

(12) the current-to-voltage converters collecting total output currents received from the M number of nonvolatile memory devices arranged in each column of the nonvolatile memory array, respectively; moreover, N number of summed currents being further converted to N number of output voltages, respectively;

(13) converting the N number of output voltages to $$\frac{N}{2}$$

number of differential values by applying a voltage subtracting procedure to every two of the N number of output voltages; subsequently, setting the differential voltages greater than a third reference voltage to "11" state, setting the differential voltages smaller than a fourth reference voltage to "00" output state, and setting the differential voltages greater than the fourth reference voltage and smaller than the third reference voltage to "10" or "01" output state, so as to produce $$\frac{N}{2}$$

number of output states;

(14) providing a target state set comprising $$\frac{N}{2}$$

number of target states, and then producing $$\frac{N}{2}$$

number of error states by comparing the $$\frac{N}{2}$$

number of target states with the corresponding $$\frac{N}{2}$$

number of output states;

(15) using the controlling unit to apply an adjusting operation to the M×N number of nonvolatile memory devices based on the corresponding $$\frac{N}{2}$$

number of error states;
- (16) repeatedly executing the steps (11)-(15) until all errors are within a pre-determined range or a predetermined number of iterations are reached; and
- (17) if there is a plurality of input voltage sets provided, selecting another input voltage set comprising M number of input voltages from the plurality of input voltage sets, and repeatedly executing the steps (11)-(16) until all input voltage sets are selected.

9. The method of claim 8, wherein the nonvolatile memory device is selected from the group consisting of non-overlapped implementation (NOI) MOSFET, floating gate memory cell, resistive random access memory (RRAM) cell, phase-change memory (PCM) cell, magnetoresistive random-access memory (MRAM) cell, and silicon-oxide-nitride-oxide-silicon (SONOS) memory cell.

10. The method of claim 8, wherein the adjusting operation includes a writing operation which comprises following steps:
the controlling unit applying programming signals to bias the nonvolatile memory devices for a programming time through the decoder unit, the bit line voltage regulating unit and the word line voltage regulating unit.

11. The method of claim 8, wherein the adjusting operation includes an erasing operation which comprises following detail steps:
the controlling unit applying erasing signals to bias the nonvolatile memory devices for an erasing time through the decoder unit, the bit line voltage regulating unit and the word line voltage regulating unit.

12. The method of claim 10, wherein the writing operation is carried out by making channel hot carrier injection (CHEI) occurring in the nonvolatile memory devices.

13. The method of claim 11, wherein the erasing operation is carried out by making band-to-band tunneling hot carrier injection occurring in the nonvolatile memory devices.

14. The method of claim 8, wherein the adjusting operation can be applied to one nonvolatile memory device or simultaneously multiple nonvolatile memory devices in the nonvolatile memory array.

* * * * *